(12) United States Patent
Ong

(10) Patent No.: US 8,077,501 B2
(45) Date of Patent: Dec. 13, 2011

(54) DIFFERENTIAL READ AND WRITE ARCHITECTURE

(75) Inventor: Adrian E. Ong, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 250 days.

(21) Appl. No.: 12/558,451

(22) Filed: Sep. 11, 2009

(65) Prior Publication Data

US 2011/0063897 A1    Mar. 17, 2011

(51) Int. Cl.
G11C 11/00    (2006.01)
(52) U.S. Cl. .................. 365/158; 365/171; 365/173
(58) Field of Classification Search .................. 365/158, 365/171, 173
See application file for complete search history.

(56) References Cited

U.S. PATENT DOCUMENTS

| | | |
|---|---|---|
| 6,421,293 B1 | 7/2002 | Candelier et al. |
| 6,552,928 B1 * | 4/2003 | Qi et al. ........................ 365/171 |
| 6,590,825 B2 | 7/2003 | Tran et al. |
| 6,842,361 B2 | 1/2005 | Miyatke et al. |
| 7,394,685 B2 | 7/2008 | Ooishi et al. |
| 7,742,329 B2 | 6/2010 | Yoon et al. |
| 7,936,592 B2 | 5/2011 | Wang et al. |
| 2008/0189588 A1 | 8/2008 | Tanaka et al. |
| 2008/0215954 A1 | 9/2008 | Oshikiri |

OTHER PUBLICATIONS

Notice of Allowance for U.S. Appl. No. 12/544,189, mailed on Aug. 24, 2011.

* cited by examiner

*Primary Examiner* — Son Dinh
*Assistant Examiner* — Nam Nguyen
(74) *Attorney, Agent, or Firm* — Kilpatrick Townsend & Stockton LLP; Ardeshir Tabibi

(57) ABSTRACT

A memory cell includes a pair of magnetic tunnel junctions and a pair of associated transistors. The magnetic tunnel junctions of the pair are differentially disposed so that in response to the applied voltages, when one them stores a logic one, the other one stores a logic zero. Accordingly, the read operation margin is increased by a factor of two. The true and complementary bit lines of the differential memory cell are coupled to a sense amplifier. Consequently, the need for using reference bit lines is eliminated.

20 Claims, 7 Drawing Sheets

DIFFERENTIAL READ AND WRITE ARCHITECTURE

BACKGROUND OF THE INVENTION

The present invention relates to memory integrated circuits, and more particularly to a magnetic random access memory cell adapted to store differential data.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash Erasable Programmable Read Only Memory (Flash EPROM) or a magnetic random access memory (MRAM), retains its charge even after the power applied thereto is turned off. Therefore, where loss of data due to power failure or termination is unacceptable, a non-volatile memory is used to store the data.

FIG. 1A is a simplified cross-sectional view of a magnetic tunnel junction (MTJ) structure 10 used in forming a spin torque transfer (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 14 are assumed to have the same magnetization direction, i.e., they are in a parallel state. In FIG. 1B, reference layer 12 and free layer 14 are assumed to have opposite magnetization directions, i.e., they are in an anti-parallel state. In FIG. 1C, reference layer 12 and free layer 14 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 16 to free layer 12 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in STT-MRAM 30 is different than the current used to write a "0". The asymmetry in the direction of current flow during these two write conditions is caused by the asymmetry in the gate-to-source voltage of transistor 20. Accordingly, a write driver circuit adapted to deliver sufficient current to write a "0", may not be able to provide enough current to write a "1". Similarly, a write driver circuit adapted to deliver sufficient current to write a "1" may deliver a current that is greater than what would otherwise be an acceptable current level to write a "0".

In the following description, an STT-MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state Conversely, an STT-MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of STT-MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

As described above, the voltage required to switch an MTJ from an AP sate to a P state, or vice versa, must exceed a critical value $V_c$. The current corresponding to this voltage is referred to as the critical current $I_c$. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no voltage. Likewise, the resistance of the MTJ is $R_{low}$ when it is in P state and receives no voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, one of the current carrying terminals (SL) of transistor 20 is coupled to the ground potential via a resistive path (not shown), a positive voltage $V_{cc}$ is applied to the gate node (WL or wordline) of transistor 20, and a positive voltage $V_{cc}$ is applied to the other current carrying terminal (BL or bitline) of transistor 20.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage $V_{cc}$, and node BL is coupled to the ground potential via a resistive path (not shown). Accordingly, during a write "1" operation, the gate-to-source voltage of transistor 20 is set to ($V_{WL}-V_{SN}$), and the drain-to-source voltage of transistor 20 is set to ($V_{SL}-V_{SN}$). FIG. 5B shows an exemplary timing diagram of the voltage levels $V_{WL}$, $V_{SL}$, $V_{SN}$, and $V_{BL}$ during a write "1" operation.

FIG. 5 is a schematic diagram of a portion of an array 100 of STT-MRAM cells. Array 100 is shown as including, in part, N columns, a write driver 104, and a sense amplifier 102. Three of the columns, namely columns 1, 2 and N, are shown in FIG. 5. It is understood that array 100 includes a multitude of rows only one of which is shown for simplicity. Lines (nodes) $BL_1$ and $SL_1$ represent the bit lines and source lines associated with the MTJ cells disposed in column 1; lines $BL_2$ and $SL_2$ represent the bit lines and source lines associated with the MTJ cells disposed in column 2; lines $BL_N$ and $SL_N$ represent the bit lines and source lines associated with the MTJ cells disposed in column N. Lines $BL_1$, $BL_2$ ... $BL_N$ are shown as being coupled to output terminal WBL of write driver 104. Likewise, lines $SL_1$, $SL_2$ ... $SL_N$ are shown as being coupled to output line WSL of write driver 104. Output terminal WBL is coupled to a first input terminal of sense amplifier 102. The second terminal of sense amplifier 102 is coupled to a reference line MREF. To select an MTJ, the row and column associated with that MTJ are activated. For example, to select MTJ $10_1$ disposed in column 1, signal lines WL, and $CS_1$ both receive high voltages. Likewise, to select MTJ $10_N$, signal lines WL, and $CS_N$ both receive high voltages.

During a read operation, write driver 104 causes line WSL to be pulled to the ground potential and line WBL to be tri-stated. This causes the current that flows through that MTJ to be sensed by sense amplifier 102. Transistor 106 provides a discharge path to ground for this current. The other input terminal of sense amplifier 102 receives a reference current $I_{ref}$ that corresponds to an average of a current representing a stored "1" and a current representing a stored "0". Sense amplifier 102 compares this reference current to the current supplied by the selected MTJ to determine the data stored therein. To write to an MTJ, the bit lines and source lines associated with that MTJ are driven to the required programming voltages by write driver 104, as is known to those skilled in the art.

BRIEF SUMMARY OF THE INVENTION

In accordance with one embodiment of the present invention, a STT magnetic memory cell disposed in a memory array includes, in part, a pair of magnetic tunnel junctions and a pair of associated transistors. The first magnetic tunnel junction has a first terminal coupled to a first signal line, and a second terminal coupled to one of the current carrying terminals of its associated transistor. The second current carrying terminal of the transistor associated with the first magnetic tunnel junction is coupled to a second signal line. The second magnetic tunnel junction has a first terminal coupled to a third signal line, and a second terminal coupled to one of the current carrying terminals of its associated transistor. The second current carrying terminal of the transistor associated with the second magnetic tunnel junction is coupled to a fourth signal line. The gate terminals of the first and second transistors are coupled to one another.

In accordance with another embodiment of the present invention, a STT magnetic memory cell disposed in a memory array includes, in part, a pair of magnetic tunnel junctions and a pair of associated transistors. The first magnetic tunnel junction has a first terminal coupled to a first signal line, and a second terminal coupled to one of the current carrying terminals of its associated transistor. The second current carrying terminal of the transistor associated with the first magnetic tunnel junction is coupled to a second signal line. The second magnetic tunnel junction has a first terminal coupled to the first signal line, and a second terminal coupled to one of the current carrying terminals of its associated transistor. The second current carrying terminal of the transistor associated with the second magnetic tunnel junction is coupled to a third signal line. Accordingly, the first and second magnetic tunnel junctions have a common node.

BRIEF DESCRIPTION OF THE DRAWINGS

FIG. 2A shows a number of layers of a spin torque transfer magnetic tunnel junction coupled to an associated select transistor, as known in the prior art.

FIG. 2B is a schematic representation of the spin torque transfer magnetic tunnel junction and its associated select transistor of FIG. 2A, as known in the prior art.

FIG. 3 shows the variation in the resistance of the spin torque transfer magnetic tunnel junction of FIG. 2A in response to applied voltages, as known in the prior art.

DETAILED DESCRIPTION OF THE INVENTION

A spin torque transfer (STT) magnetic memory cell, in accordance with one embodiment of the present invention, includes a pair of magnetic tunnel junctions (MTJ) and a pair of associated transistors. The magnetic tunnel junctions are differentially disposed so that in response to the applied voltages during a write cycle, one of the magnetic tunnel junctions stores a logic one while the other stores a logic zero. Accordingly, because the current difference is defined by $[I(R_{High})-I(R_{Low})]$ instead of $[I(R_{High})-I(Ref)]$ or $[I(Ref)-I(R_{Low})]$ where:

$$I(Ref)=[I(R_{High})-I(R_{Low})]/2$$

the read margin is increased by a factor of 2. It is understood that $I(R_{High})$ represents a current flowing through a MTJ having a high resistance, and $I(R_{low})$ represents a current flowing through a MTJ having a low resistance. The true and complementary bit lines of the differential memory cell are coupled to a sense amplifier. Consequently, the need for using reference bit lines is eliminated.

Figure 1A:
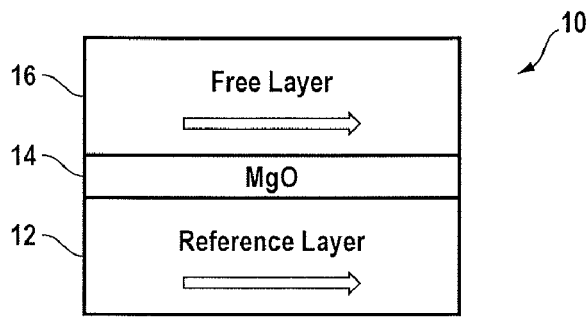
FIG. 1A is a simplified cross-sectional view of a spin torque transfer magnetic tunnel junction of a magnetic random access memory cell when placed in a parallel magnetization state, as known in the prior art.
Figure 1B:
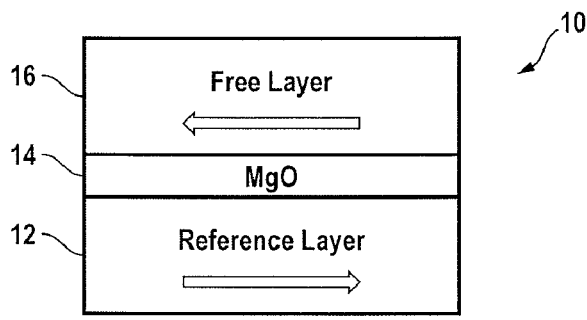
FIG. 1B shows the spin torque transfer magnetic tunnel junction of FIG. 1A when placed in an anti-parallel magnetization state, as known in the prior art.
Figure 1C:
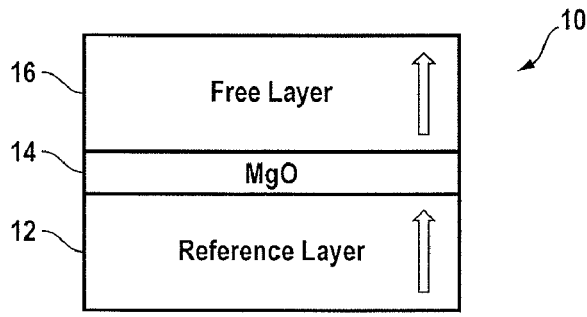
FIG. 1C is a simplified cross-sectional view of a spin torque transfer magnetic tunnel junction of a magnetic random access memory cell when placed in a parallel magnetization state, as known in the prior art.
Figure 1D:
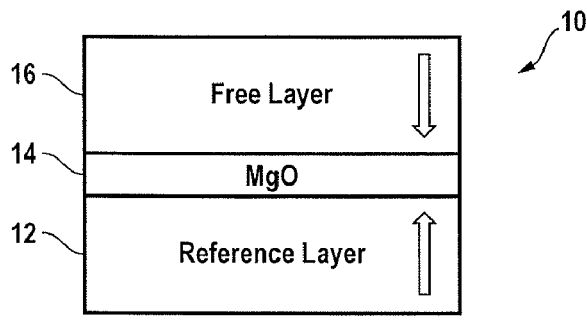
FIG. 1D shows the spin torque transfer magnetic tunnel junction of FIG. 1D when placed in an anti-parallel magnetization state, as known in the prior art.
Figure 4A:
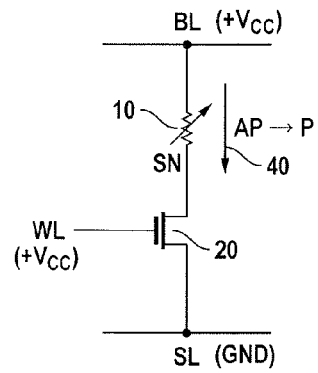
FIG. 4A shows a spin torque transfer magnetic tunnel junction being programmed to switch from an anti-parallel state to a parallel state, as known in the prior art.
Figure 4B:
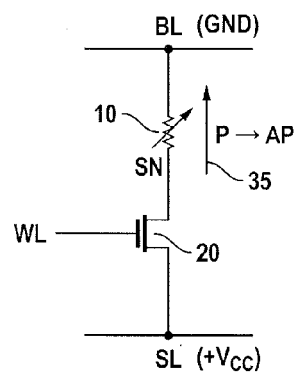
FIG. 4B shows a spin torque transfer magnetic tunnel junction being programmed to switch from a parallel state to an anti-parallel state, as known in the prior art.
Figure 5:
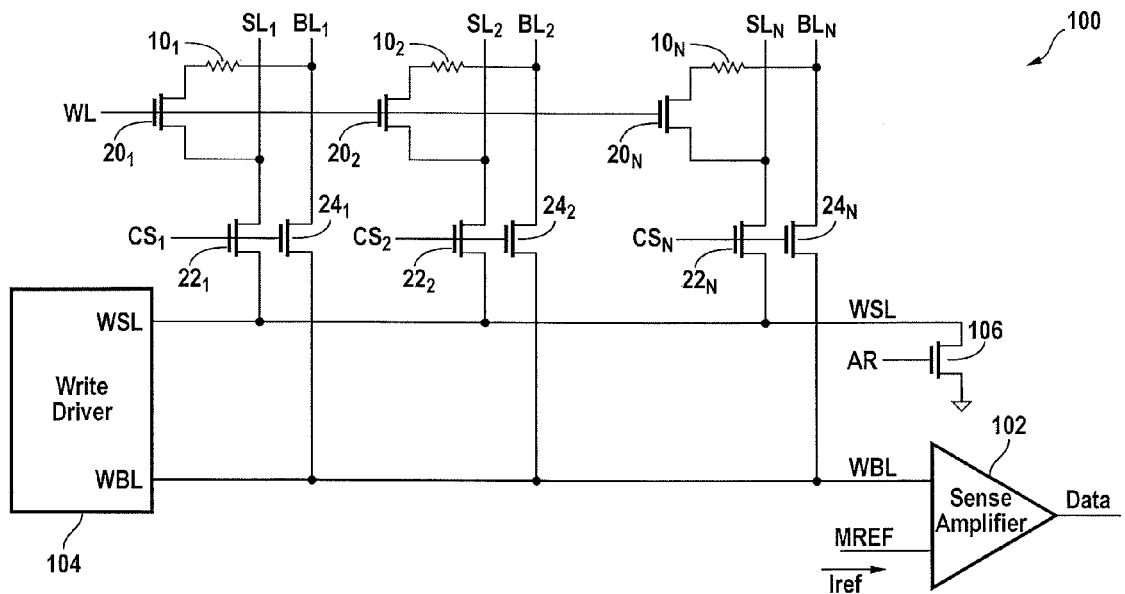
FIG. 5 is a schematic diagram of a portion of an array of spin torque transfer magnetic random access memory cells.
Figure 6:
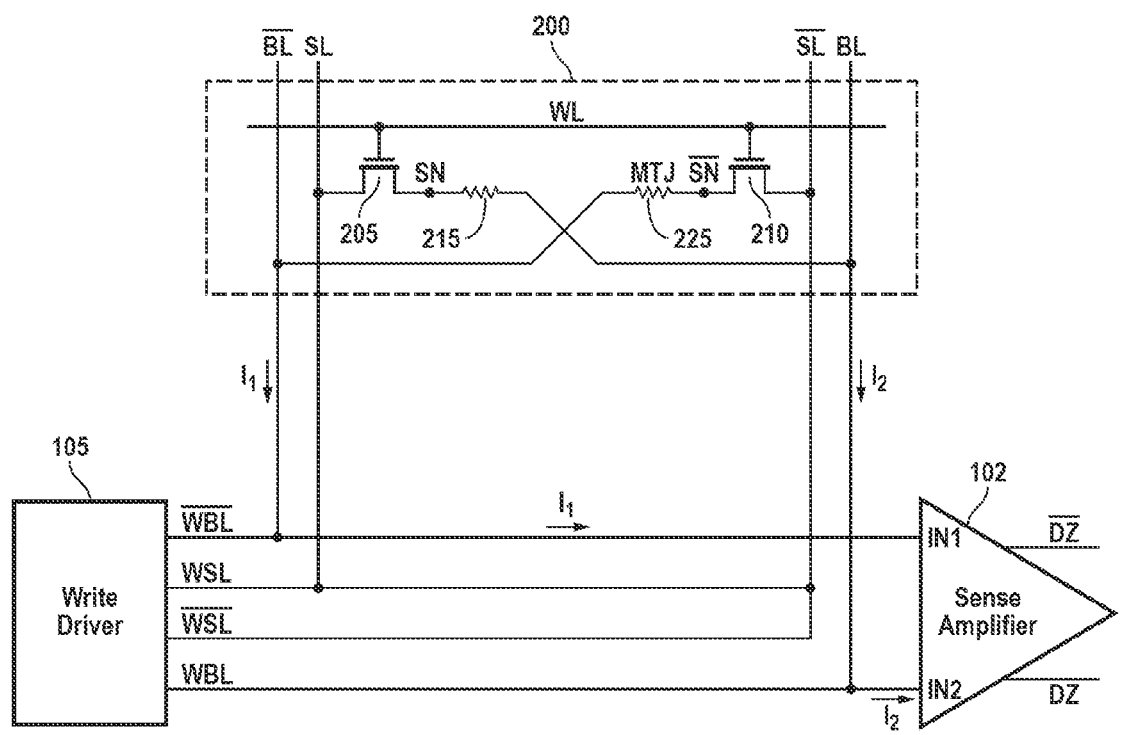
FIG. 6 is a schematic diagram of a spin torque transfer magnetic memory cell in communication with a write driver circuit and a sense amplifier, in accordance with one embodiment of the present invention.

FIG. 6 is an exemplary STT-MRAM cell 200, in accordance with one embodiment of the present invention. The STT-MRAM cell (hereinafter alternatively referred to as memory cell) 200 is shown as including a pair of select transistors, 205, 210, and a pair of magnetic tunneling junction junctions (alternatively referred to herein as magnetic tunneling structure, or magnetic tunneling junction structure or MTJ) 215 and 225 that are so disposed as to store and supply differential data. Magnetic tunneling junction 215 is associated with select transistor 205. Likewise, magnetic tunneling junction 215 is associated with select transistor 205. Select transistors 205 and 210 may be NMOS, PMOS, BICOMS, or any other types of transistors.

The true and complementary bit lines, BL and $\overline{BL}$ carry complementary signals. Likewise, the true and complementary source lines, SL and $\overline{SL}$ carry complementary signals. In the following description, it is understood that the term complementary signals refers to a pair of signals one which has a higher value than the other. MTJ 215 is connected to bit line BL directly and to the source line SL through select transistor 205. Likewise, MTJ 225 is connected to the differential bit line $\overline{BL}$ directly and to the differential source line $\overline{SL}$ through select transistor 210. Wordline WL that receives a signal from a row decoder (not shown) is connected to the gate terminals of both transistors 205 and 210.

The signal applied to line BL is a logic complement of the signal applied to line $\overline{BL}$, and the signal applied to line SL is a logic complement of the signal applied to $\overline{SL}$. To store a logic "1" in memory cell 200, signals SL and $\overline{BL}$ go high, and signals $\overline{SL}$ and BL go low. To store a logic "0" in memory cell 200, signals $\overline{SL}$ and BL go high, and signals SL and $\overline{BL}$ goes low. The MTJs 225 and 215 are adapted to store complementary data and thus form a differential magnetic random access memory cell. Signals applied to the true bit line BL and source line SL as well as those applied to the complementary bit line $\overline{BL}$ and source line $\overline{SL}$ are supplied by write driver 105 during read and write cycles. For example, when lines BL and SL are supplied with Vcc and 0 volts respectively, lines $\overline{BL}$ and $\overline{SL}$ are supplied with 0 volts and Vcc volts respectively.

During a read cycle, the true and complementary bit lines BL and $\overline{BL}$ are pre-charged to a read voltage using a voltage source disposed in sense amplifier 102 (not shown). Both source lines SL and $\overline{SL}$ are coupled to the ground potential via write driver 105 during read cycles. Accordingly, current $I_1$ is delivered from MTJ 225 to input terminal IN1 of sense amplifier 102 via bit line $\overline{BL}$, and current $I_2$ is delivered from MTJ 215 to input terminal IN2 of sense amplifier 102 via bit line BL. Advantageously, sense amplifier 102 requires no reference current. Furthermore, because currents $I_1$ and $I_2$ represent complementary data, the sensing of the data is carried out quickly. Consequently, the read operational margin increases by a factor of two as the requirement for the tunneling magnetoresistance is reduced by nearly one-half compared to conventional STT MRAMs. Furthermore, by eliminating the need for the reference bit line generators and the redundant reference bit lines, significant savings in silicon area is achieved thus partly compensating for any increase in cell size. Moreover, by eliminating potential failures associated with faulty reference bit lines, reliability is enhanced.

Figure 7:
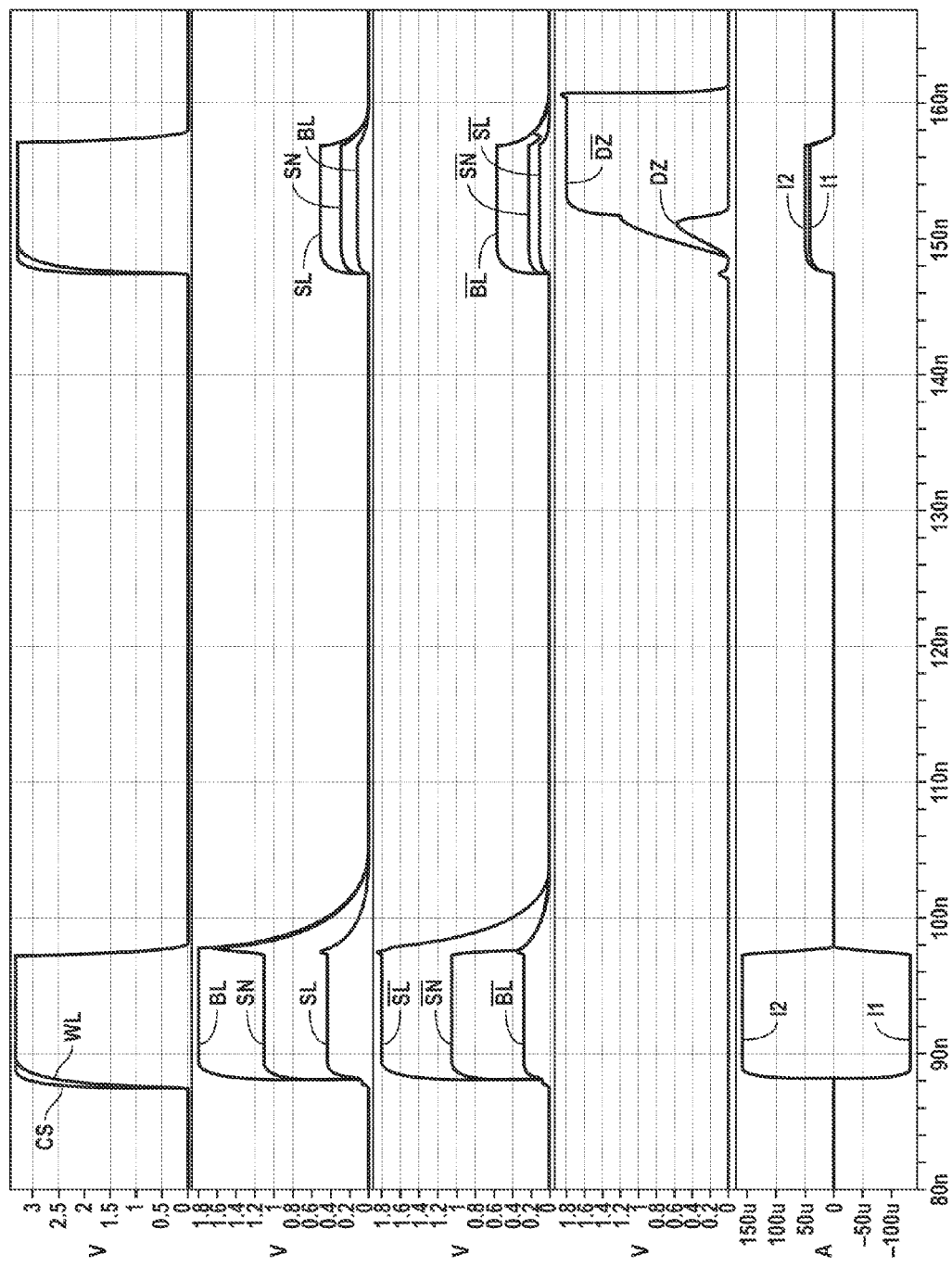
FIG. 7 is an exemplary timing diagram of a number of signals associated with the spin torque transfer magnetic memory cell of FIG. 6 during read/write operations.

FIG. 7 is an exemplary simulation timing diagram of a number of signals associated with STT-MRAM cell 200 during write and read operations. During the write operation, MTJ 215 is programmed to store a '0' and MTJ 225 is programmed to store a "1" between. To achieve this, the row and column in which STT-MRAM 200 is disposed are shown as being selected between the times 88 nsec and 98 nsec using wordline select signal WL and column select signal CS. Write driver circuit 105 then causes signals BL, $\overline{SL}$ to go high and signals $\overline{BL}$ and SL to go low. The voltages at nodes SN, $\overline{SN}$, as well as current $I_1$ and $I_2$ are also shown. Between the times 148 nsec and 158 nsec, a read operation is performed. Accordingly, write driver 105 causes signals WBL and $\overline{WBL}$ to float and sense amplifier 102 is activated. Currents I1 and I2 flowing through STT-MRAMs 215 and 225 are differentially sensed by sense amplifier 102. Output signals DZ and $\overline{DZ}$ represent the logical "1" and "0" data stored respectively in MTJs 225 and 215.

Figure 8:
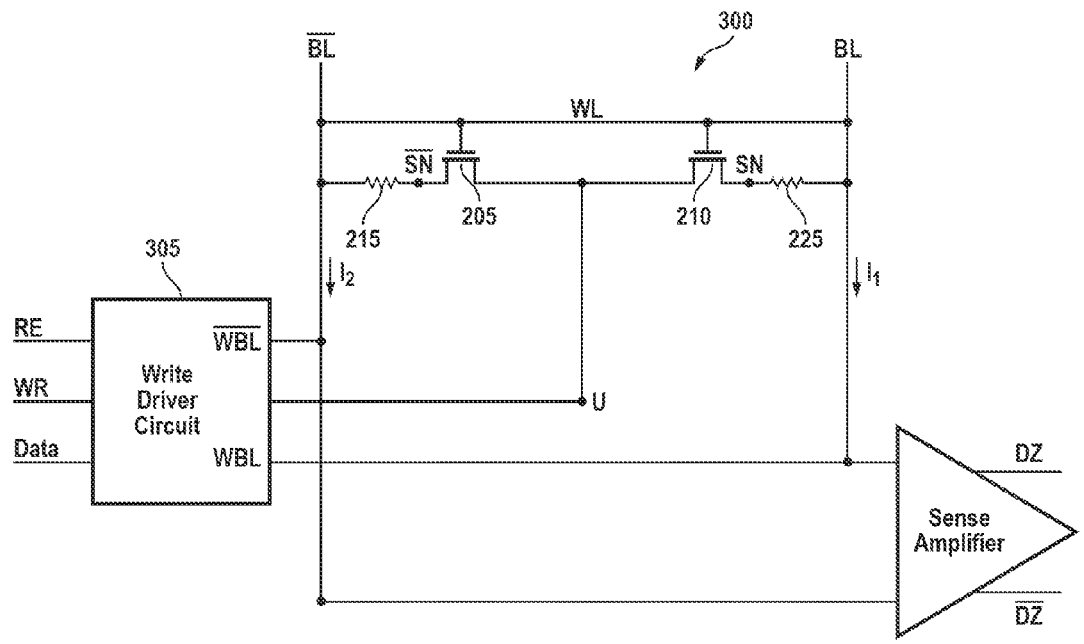
FIG. 8 is a schematic diagram of a spin torque transfer magnetic memory cell in communication with a write driver circuit and a sense amplifier, in accordance with another embodiment of the present invention.

FIG. 8 is a schematic diagram of an exemplary STT-MRAM cell 300, in accordance with another embodiment of the present invention. The STT-MRAM cell 300 is shown as including a pair of select transistors 205, 210, and a pair of MTJs 215 and 225 that are disposed to store and supply differential data. As is seen, transistors 205 and 210 share a common node U. Memory cell 300 is shown as being coupled to write driver circuit 305 and sense amplifier 310. Bit lines BL and $\overline{BL}$ are coupled to output terminals WBL and $\overline{WBL}$ of write derive circuit 305. Node U is coupled to output terminal WU of write driver circuit 305.

Wordline WL that receives a signal from a row decoder (not shown) is coupled to the gate terminals of transistors 205 and 210. Bitline BL is coupled to one of the terminals of MTJ 225, likewise complementary bitline $\overline{BL}$ is coupled to one of the terminals of MTJ 215.

In one exemplary embodiment, to write a "0" to MTJ 225 and a "1" to MTJ 215, write driver circuit 305 sets the voltage of line BL to a first supply voltage $V_{cc}$, sets the voltage at node U to the ground potential (0 volt) and sets the voltage of line $\overline{BL}$ to $-V_{cc}$ volts. Conversely, to write a "1" to MTJ 225 and a "0" to MTJ 215, write driver circuit 305 sets the voltage of line BL to $-V_{cc}$, sets the voltage at node U to the ground potential and sets the voltage of line $\overline{BL}$ to $V_{cc}$ volts. In other embodiments, to write a "0" to MTJ 225 and a "1" to MTJ 215, write driver circuit 305 sets the voltage of line BL to $V_{cc}$, sets the voltage at node U to $V_{cc}/2$ and sets the voltage of line $\overline{BL}$ to 0 volt. In such embodiments, to write a "1" to MTJ 225 and a "0" to MTJ 215, write driver circuit 305 sets the voltage of line BL to 0, sets the voltage at node U to Vcc/2 and sets the voltage of bitline $\overline{BL}$ to $V_{cc}$. It is understood that other combinations of programming voltages may also be applied.

To read the data stored in memory cell 300, write driver circuit 305 tristates its output terminals WBL and $\overline{WBL}$, and sets the voltage at node U to 0 volt. Accordingly, bit lines BL and $\overline{BL}$ are controlled by and receive the currents represented by the data stored in MTJs 215 and 225. These currents are delivered to sense amplifier 310 which senses the differential currents to determine the data stored in memory cell 300.

Figure 9:
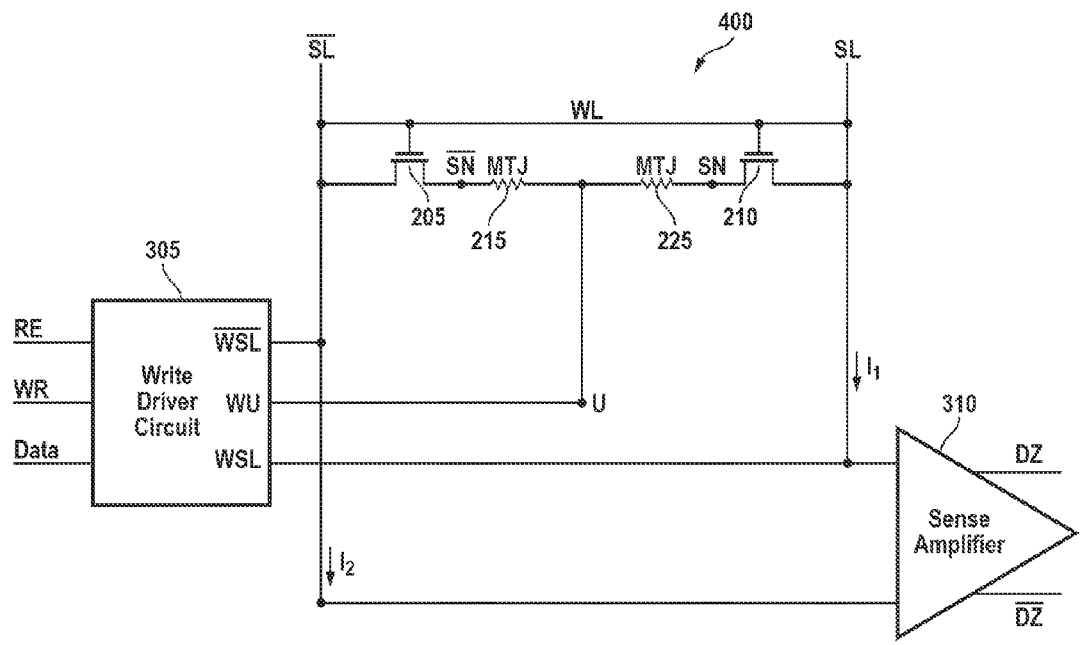
FIG. 9 is a schematic diagram of a spin torque transfer magnetic memory cell in communication with a write driver circuit and a sense amplifier, in accordance with another embodiment of the present invention.

FIG. 9 is a schematic diagram of an exemplary STT-MRAM cell 400, in accordance with another embodiment of the present invention. The STT-MRAM cell 400 is shown as including a pair of select transistors 205, 210, and a pair of MTJs 215 and 225 that are disposed to store and supply differential data. As is seen, MTJs 215 and 225 share a common node U. Memory cell 400 is shown as being coupled to write driver circuit 305 and sense amplifier 310. Source lines SL and $\overline{SL}$ are coupled to output terminals WSL and $\overline{WSL}$ of write derive circuit 305. Node U is coupled to output terminal WU of write driver circuit 305.

Wordline WL that receives a signal from a row decoder (not shown) is coupled to the gate terminals of transistors 205 and 210. Source line SL is coupled to one of the current carrying terminals of transistor 210, likewise complementary source line $\overline{SL}$ is coupled to one of the current carrying terminals of transistor 205.

To write a "0" to MTJ 225 and a "1" to MTJ 215, write driver circuit 305 sets the voltage of line SL to the ground potential, the voltage at node U to $V_{cc}$, and the voltage of line $\overline{SL}$ to $2V_{cc}$ volts. Conversely, to write a "1" to MTJ 225 and a "0" to MTJ 215, write driver circuit 305 sets the voltage of line SL to $V_{cc}$, sets the voltage at node U to the ground potential and sets the voltage of line $\overline{SL}$ to $-V_{cc}$ volts. It is understood that other combinations of programming voltages may also be applied.

Figure 10:
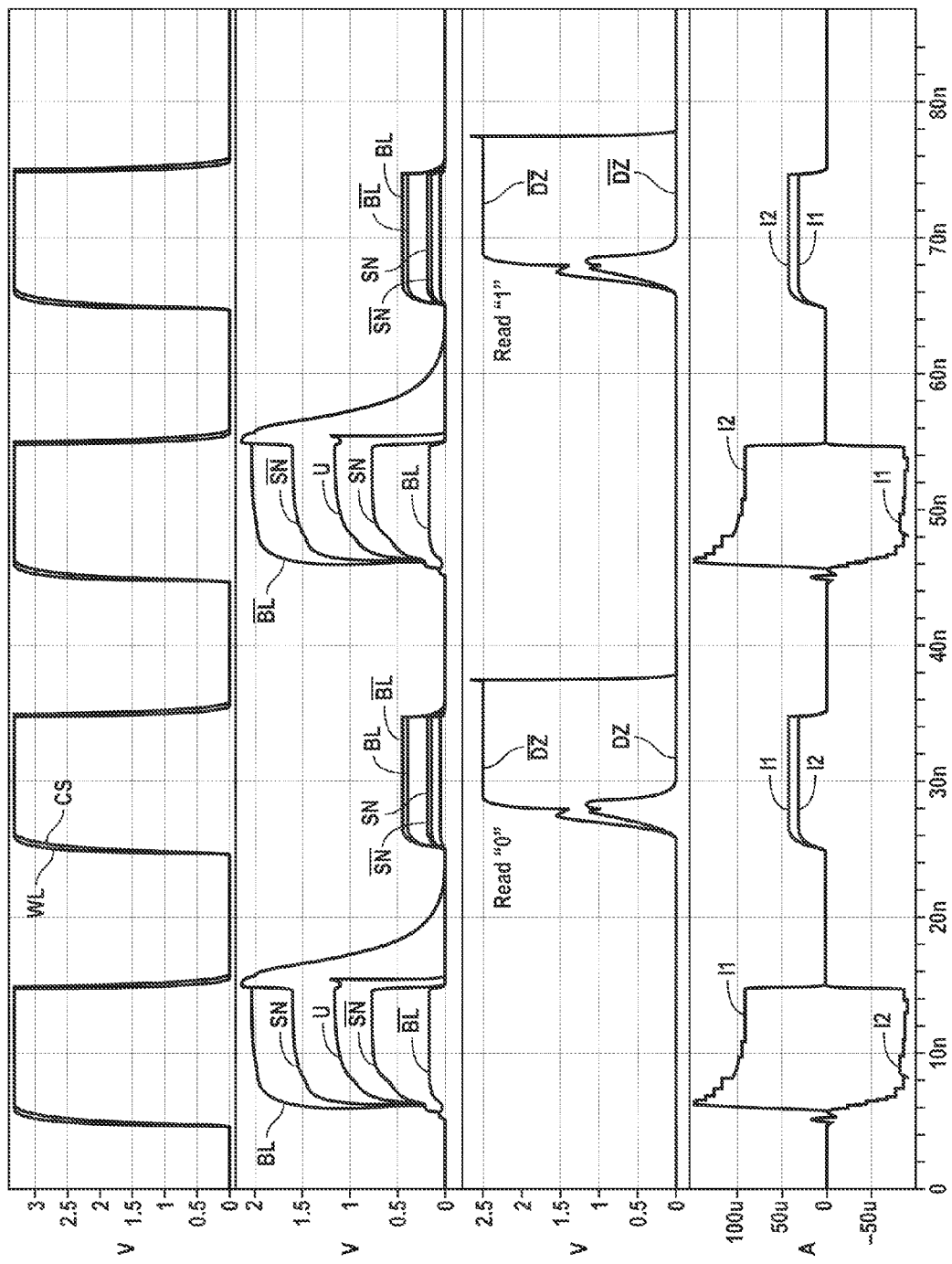
FIG. 10 is an exemplary timing diagram of a number of signals associated with the spin torque transfer magnetic memory cell of FIG. 9 during read/write operations.

FIG. 10 is an exemplary simulation timing diagram of a number of signals associated with STT-MRAM cell 300 of FIG. 8 during write and read operations. Between the times 6 nsec and 16 nsec, MTJ 215 is programmed to store a '1' and MTJ 225 is programmed to store a "0". To achieve this, the row and column in which cell 300 is disposed are selected using wordline select signal WL and a column select signal CS. In response, write driver circuit 105 causes signal BL to go high and signal $\overline{BL}$ to go low. The voltages at nodes SN, $\overline{SN}$, as well as current $I_1$ and $I_2$, flowing respectively through lines BL and $\overline{BL}$ are also shown. Between the times 24 nsec and 36 nsec, a read operation is performed. Accordingly, write driver 105 causes signals WBL and $\overline{WBL}$ to float and sense amplifier 102 is activated. Currents $I_1$ and $I_2$ flowing through MTJs 215 and 225 are differentially sensed by sense amplifier 102. Output signals $\overline{DZ}$ and DZ represent the logical "1" and "0" data stored respectively in MTJs 215 and 225. Between the times 46 nsec and 56 nsec, MTJ 215 is programmed to store a '0' and MTJ 225 is programmed to store a "1". To achieve this, write driver circuit 105 causes signal BL to go low and signal $\overline{BL}$ to go high. Between the times 64 nsec and 76 nsec, a read operation is performed. Accordingly, write driver 105 causes signals WBL and $\overline{WBL}$ to float and sense amplifier 102 is activated. Output signals $\overline{DZ}$ and DZ represent the logical "0" and "1" data stored respectively in MTJs 215 and 225.

Figure 11:
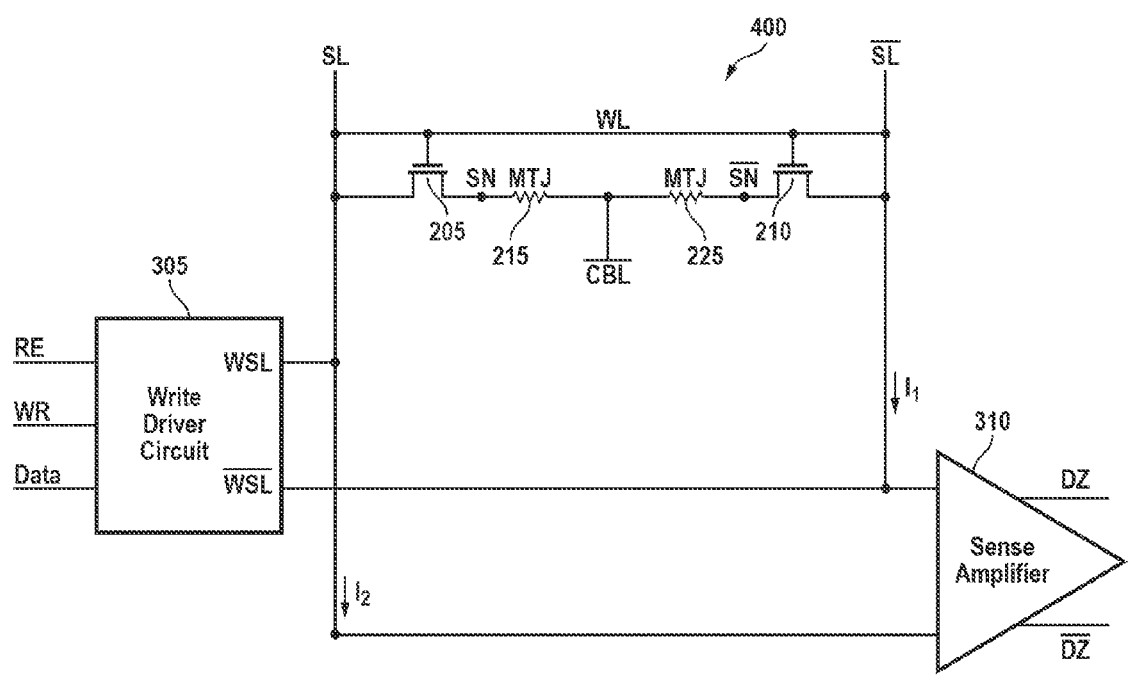
FIG. 11 is a schematic diagram of a spin torque transfer magnetic memory cell in communication with a write driver circuit and a sense amplifier, in accordance with another embodiment of the present invention.

FIG. 11 is a schematic diagram of an exemplary STT-MRAM cell 500, in accordance with another embodiment of the present invention. The STT-MRAM cell 500 is shown as including a pair of select transistors 205, 210, and a pair of MTJs 215 and 225 that are disposed to store and supply differential data. As is seen, MTJs 215 and 225 share a common node CBL. Memory cell 500 is shown as being coupled to write driver circuit 305 and sense amplifier 310. Source lines SL and $\overline{SL}$ are coupled to output terminals WSL and $\overline{WSL}$ of write derive circuit 305. Wordline WL that receives a signal from a row decoder (not shown) is coupled to the gate terminals of transistors 205 and 210. Source line SL is coupled to one of the current carrying terminals of transistor 210, likewise complementary source line $\overline{SL}$ is coupled to one of the current carrying terminals of transistor 205. In one embodiment, common node CBL may receive a DC reference voltage (such as half of supply voltage $V_{cc}$). In another embodiment, common node CBL may receive a voltage generated by a voltage generator. In yet another embodiment, when signal lines SL and $\overline{SL}$ are supplied with voltages between $\pm V_{CC}$, common node CBL may be connected to the ground potential (GND).

The above embodiments of the present invention are illustrative and not limitative. Various alternatives and equivalents are possible. The embodiments of the present invention are not limited by the type or the number of the STT magnetic random access memory cells used in a memory array. The embodiments of the present invention are not limited by the number of layers used to form a STT magnetic tunnel junction. The embodiments of the present invention are not limited by the voltage levels applied to the STT magnetic memory cells during read or write operations. Nor are the embodiments of the present invention limited by the write driver circuit or the sense amplifier used to read the data. The embodiments of the present invention are not limited by the type of transistor, PMOS, NMOS or otherwise, used to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. Other additions, subtractions or modifications are obvious in view of the present invention and are intended to fall within the scope of the appended claims.

What is claimed is:

1. A memory cell comprising:
   a first magnetic tunnel junction having a first terminal coupled to a first signal line;
   a first transistor having a first current carrying terminal coupled to a second signal line and a second current carrying terminal coupled to a second terminal of the first magnetic tunnel junction;

a second magnetic tunnel junction having a first terminal coupled to a third signal line; and a second transistor having a first current carrying terminal coupled to a fourth signal line and a second current carrying terminal coupled to a second terminal of the second magnetic tunnel junction, wherein gate terminals of said first and second transistors are coupled to one another.

2. The memory cell of claim 1 wherein said first and third signal lines carry voltage signals that are logic complements of one another, and wherein said second and fourth signals lines carry voltage signals that are logic complements of one another.

3. The memory cell of claim 1 wherein when the first magnetic tunnel junction stores a logical one, the second magnetic tunnel junction stores a logical zero, and when the first magnetic tunnel junction stores a logical zero, the second magnetic tunnel junction stores a logical one.

4. The memory cell of claim 1 further comprising:
a sense amplifier having a first input terminal coupled to the second signal line, and a second input terminal coupled to the fourth signal line.

5. A method of forming a memory cell, the method comprising:
connecting a first terminal of a first magnetic tunnel junction to a first signal line;
connecting a first current carrying terminal of a first transistor to a second terminal of the first magnetic tunnel junction;
connecting a second current carrying terminal of the first transistor to a second signal line;
connecting a first terminal of a second magnetic tunnel junction to a third signal line;
connecting a first current carrying terminal of a second transistor to a second terminal of the second magnetic tunnel junction;
connecting a second current carrying terminal of the second transistor to a fourth signal line; and
connecting gate terminals of the first and second transistors to one another.

6. The method of claim 5 further comprising:
applying a first voltage to the first signal line;
applying a logic complement of the first voltage to the third signal line;
applying a second voltage to the second signal line;
applying a logic complement of the second voltage to the fourth signal line.

7. The method of claim 5 further comprising:
storing a first data in the first magnetic tunnel junction; and
storing a logic complement of the first data in the second magnetic tunnel junction.

8. The method of claim 7 further comprising:
coupling the first signal line to a first input terminal of a sense amplifier; and
coupling the second signal line to a second input terminal of the sense amplifier.

9. A memory cell comprising:
a first magnetic tunnel junction having a first terminal coupled to a first signal line;
a first transistor having a first current carrying terminal coupled to a second signal line and a second current carrying terminal coupled to a second terminal of the first magnetic tunnel junction;
a second magnetic tunnel junction having a first terminal coupled to the first signal line; and a second transistor having a first current carrying terminal coupled to a third signal line and a second current carrying terminal coupled to a second terminal of the second magnetic tunnel junction, wherein gate terminals of said first and second transistors are coupled to one another.

10. The memory cell of claim 9 wherein said second signal line receives a first supply voltage, said first signal line receives the ground potential and said third signal line receives a third supply voltage having a magnitude substantially similar to that of the first supply voltage and a polarity opposite to a polarity of the first supply voltage.

11. The memory cell of claim 9 wherein said second signal line receives a first supply voltage, said second signal line receives a second supply voltage half the first supply voltage, and said third signal line receives the ground potential.

12. The memory cell of claim 9 wherein when the first magnetic tunnel junction stores a logical one, the second magnetic tunnel junction stores a logical zero, and when the first magnetic tunnel junction stores a logical zero, the second magnetic tunnel junction stores a logical one.

13. The memory cell of claim 9 further comprising a sense amplifier comprising a first input terminal coupled to the second signal line and a second input terminal coupled to the third signal line.

14. A method of forming a memory cell, the method comprising:
connecting a first terminal of a first magnetic tunnel junction to a first signal line;
connecting a first current carrying terminal of a first transistor to a second terminal of the first magnetic tunnel junction;
connecting a second current carrying terminal of the first transistor to a second signal line;
connecting a first terminal of a second magnetic tunnel junction to the first signal line;
connecting a first current carrying terminal of a second transistor to a second terminal of the second magnetic tunnel junction;
connecting a second current carrying terminal of the second transistor to a third signal line; and
connecting gate terminals of the first and second transistors to one another.

15. The method of claim 14 further comprising:
applying the ground potential to the first signal line;
applying a first supply voltage to the second signal line; and
applying a third supply voltage to the third signal line; said third supply voltage having a magnitude substantially similar to the first supply voltage, and a polarity opposite to a polarity of the first supply voltage.

16. The method of claim 14 further comprising:
applying the ground potential to the third signal line;
applying a first supply voltage to the second signal line; and
applying a third supply voltage that is about half the first supply voltage to the first signal line.

17. The method of claim 14 further comprising:
storing a first data in the first magnetic tunnel junction; and
storing a logic complement of the first data in the second magnetic tunnel junction.

18. The method of claim 14 further comprising:
coupling the second signal line to a first input terminal of a sense amplifier; and
coupling the third signal line to a second input terminal of the sense amplifier.

19. A memory cell comprising:
a first magnetic tunnel junction having a first terminal coupled to a first signal line;

a first transistor having a first current carrying terminal coupled to a second signal line and a second current carrying terminal coupled to a second terminal of the first magnetic tunnel junction;

a second magnetic tunnel junction having a first terminal coupled to a third signal line; and a second transistor having a first current carrying terminal coupled to the second signal line and a second current carrying terminal coupled to a second terminal of the second magnetic tunnel junction, wherein gate terminals of said first and second transistors are coupled to one another.

20. A method of forming a memory cell, the method comprising:

connecting a first terminal of a first magnetic tunnel junction to a first signal line;

connecting a first current carrying terminal of a first transistor to a second terminal of the first magnetic tunnel junction;

connecting a second current carrying terminal of the first transistor to a second signal line;

connecting a first terminal of a second magnetic tunnel junction to a third signal line;

connecting a first current carrying terminal of a second transistor to the second signal line;

connecting a second current carrying terminal of the second transistor to a second terminal of the magnetic tunnel junction; and connecting gate terminals of the first and second transistors to one another.

* * * * *

UNITED STATES PATENT AND TRADEMARK OFFICE
CERTIFICATE OF CORRECTION

PATENT NO.        : 8,077,501 B2  
APPLICATION NO.   : 12/558451  
DATED             : December 13, 2011  
INVENTOR(S)       : Adrian E. Ong It is certified that error appears in the above-identified patent and that said Letters Patent is hereby corrected as shown below:

In column 1, line 3, insert the following paragraph before the first paragraph:

--GOVERNMENT RIGHTS  
This invention was made with U.S. Government support under Grant/Contract No. H R0011-09-C-0023 awarded by DARPA. The U.S. Government retains certain rights in this invention. Distribution authorized to U.S. Government Agencies only.--

Signed and Sealed this  
First Day of March, 2016

Michelle K. Lee  
*Director of the United States Patent and Trademark Office*